United States Patent
Peuse et al.

(10) Patent No.: US 8,236,706 B2
(45) Date of Patent: Aug. 7, 2012

(54) METHOD AND APPARATUS FOR GROWING THIN OXIDE FILMS ON SILICON WHILE MINIMIZING IMPACT ON EXISTING STRUCTURES

(75) Inventors: Bruce W. Peuse, San Carlos, CA (US); Yaozhi Hu, San Jose, CA (US); Paul Janis Timans, Mountain View, CA (US); Guangcai Xing, Fremont, CA (US); Wilfried Lerch, Dornstadt (DE); Sing-Pin Tay, Fremont, CA (US); Stephen E. Savas, Fremont, CA (US); Georg Roters, Duelmen (DE); Zsolt Nenyei, Blaustein (DE); Ashok Sinha, Los Altos Hills, CA (US)

(73) Assignee: Mattson Technology, Inc., Fremont, CA (US)

( * ) Notice: Subject to any disclaimer, the term of this patent is extended or adjusted under 35 U.S.C. 154(b) by 94 days.

(21) Appl. No.: 12/334,425

(22) Filed: Dec. 12, 2008

(65) Prior Publication Data

US 2010/0151694 A1 Jun. 17, 2010

(51) Int. Cl.
*H01L 21/31* (2006.01)
*H01L 21/469* (2006.01)
(52) U.S. Cl. .................. 438/770; 438/771; 438/772
(58) Field of Classification Search .......... 438/758–794; 427/446–456, 533–560
See application file for complete search history.

(56) References Cited

U.S. PATENT DOCUMENTS

| | | | |
|---|---|---|---|
| 4,836,902 A | 6/1989 | Kalnitsky et al. | |
| 4,859,303 A | 8/1989 | Kalnitsky et al. | |
| 5,478,403 A * | 12/1995 | Shinagawa et al. | 134/1.1 |
| 5,962,083 A * | 10/1999 | Hatanaka et al. | 427/571 |
| 6,287,988 B1 | 9/2001 | Nagamine et al. | |
| 7,067,436 B2 * | 6/2006 | Yuda et al. | 438/758 |
| 7,109,083 B2 | 9/2006 | Ohmi et al. | |
| 7,141,514 B2 | 11/2006 | Chua | |
| 7,273,638 B2 | 9/2007 | Belyansky et al. | |
| 2002/0155679 A1 * | 10/2002 | Ogura et al. | 438/423 |
| 2003/0082923 A1 | 5/2003 | Ono | |

(Continued)

FOREIGN PATENT DOCUMENTS

JP H11-293470 * 10/1999

(Continued)

OTHER PUBLICATIONS

Duygu Kuzum, et al., "Ge-Interface Engineering With Ozone Oxidation for Low Interface-State Density," IEEE Electron Device Letters, Apr. 2008, pp. 328-330, vol. 29, No. 4.

(Continued)

*Primary Examiner* — Michael Lebentritt
*Assistant Examiner* — Karen Kusumakar
(74) *Attorney, Agent, or Firm* — Nixon Peabody LLP; Joseph Bach, Esq.

(57) ABSTRACT

Plasma assisted low temperature radical oxidation is described. The oxidation is selective to metals or metal oxides that may be present in addition to the silicon being oxidized. Selectivity is achieved by proper selection of process parameters, mainly the ratio of H2 to O2 gas. The process window may be enlarged by injecting H2O steam into the plasma, thereby enabling oxidation of silicon in the presence of TiN and W, at relatively low temperatures. Selective oxidation is improved by the use of an apparatus having remote plasma and flowing radicals onto the substrate, but blocking ions from reaching the substrate.

11 Claims, 10 Drawing Sheets

U.S. PATENT DOCUMENTS

| | | | |
|---|---|---|---|
| 2004/0094094 A1* | 5/2004 | Ohmi et al. | 118/723 MW |
| 2004/0132272 A1* | 7/2004 | Ku et al. | 438/585 |
| 2005/0136610 A1 | 6/2005 | Kitagawa et al. | |
| 2007/0128880 A1* | 6/2007 | Kitagawa et al. | 438/758 |
| 2007/0163617 A1* | 7/2007 | Ozaki et al. | 134/1.1 |
| 2007/0221294 A1 | 9/2007 | Sasaki | |
| 2007/0224836 A1 | 9/2007 | Sasaki et al. | |
| 2009/0104790 A1* | 4/2009 | Liang | 438/788 |

FOREIGN PATENT DOCUMENTS

| | | | |
|---|---|---|---|
| JP | 2002-246386 | * | 8/2002 |

OTHER PUBLICATIONS

Kwan-Yong Lim, et al., "Highly Reliable and Scalable Tungsten Polymetal Gate Process for Memory Devices using Low-Temperature Plasma Selective Gate Reoxidation," 2006 Symposium on VLSI Technology Digest of Technical Papers, 2006 IEEE.

Young-Joo Song, et al., "Improved Quality and Reliability of Ultrathin (1.4-2.3 nm) Gate Oxides by Radical-Assisted Oxidation Utilizing a Remote Ultraviolet Ozone Source," J. Vac. Sci. Technology B, May/Jun. 2004, pp. 1206-1209, vol. 22, No. 3, American Vacuum Society.

Kwan-Yong Lim, et al, "Influence of Hydrogen Incorporation on the Reliability of Gate Oxide Formed by Using Low-Temperature Plasma Selective Oxidation Applicable to Sub-50-nm W-Polymetal Gate Devices," IEEE Electron Device Letters, Apr. 2008, pp. 338-340, vol. 29, No. 4, 2008 IEEE.

Bruce Peuse, et al., "Leveraging a Low Pressure Thermal Module to Meet the Challenges of Advanced Device Manufacturing," $12^{th}$ IEEE International Conference on Advanced Thermal Processing of Semiconductors, 2004.

Masaki Hirayama, et al., "Low-Temperature Growth of High-Integrity Silicon Oxide Films by Oxygen Radical Generated in High-Density Krypton Plasma," 1999 IEEE.

Byung Hak Lee, et al., "Low Temperature Plasma Re-Oxidation Process for Sub-60nm Device," $211^{th}$ Meeting, (c) 2007 The Electrochemical Society.

Jun-Ying Zhang, et al., "Rapid Photo-Oxidation of Silicon at Room Temperature Using 126 nm Vacuum Ultraviolet Radiation," Applied Surface Science, 2002, pp. 64-68, vol. 186, Elsevier Science B.V.

"SPA Plasma for Sub-100nm," Solid State Technology, Jan. 2003, http://solidstate.articles.printthis.clickability.com.

Hiroyuki Oyanagi, et al., "UV Photo-Oxidation of Silicon: A Novel Growth Method of Ultra-Thin $SiO_2$ Films," National Institute of Advanced Industrial Science and Technology.

* cited by examiner

METHOD AND APPARATUS FOR GROWING THIN OXIDE FILMS ON SILICON WHILE MINIMIZING IMPACT ON EXISTING STRUCTURES

BACKGROUND

Oxidation of silicon is a fundamental technology to CMOS fabrication, dating back to the inception of the integrated circuit. The most common methods for oxidation of silicon rely on thermal processes in ambient of O2, H2O/H2, H2O/O2, O2/H2 or combinations thereof. The hardware used to provide the silicon oxidation process in the IC manufacturing are batch thermal furnaces and RTP. In conventional oxidation systems and processes, high temperature (above 700° C.) is required to provide the activation energy for the oxide growth on silicon or poly-silicon. At temperatures below 700° C., insufficient oxide growth occurs for practical consideration.

Advanced integrated circuit fabrication requires a number of process steps where thin films of silicon oxide are grown on silicon or polysilicon structures. For some applications, the oxidation process must be selective, such that other materials including tungsten are not oxidized. These critical oxidation steps are used for DRAM and FLASH memory and logic devices. Currently thermal processing in either an ambient of O2, H2O/H2, or H2O/O2, at high temperature (>700° C.) is used to perform this oxidation processes. This is typically done with an RTP system such as an ATMOS® system available from Mattson Thermal Products GmbH Dornstadt, Germany. Another single wafer alternative has offered a thermal 'radical oxidation' by thermal processing in a low pressure H2/O2 ambient. As device dimensions continue to shrink, a number of serious limitations in the afore-mentioned methods for growing these oxide films have begun to appear. The current processes all require high temperatures in excess of 700° C. and more typically on the order of 900° C. The high temperatures are necessary to obtain the oxide growth rate to make the process practical and in some cases are required for oxide quality. Many of the next generation devices will undergo serious damage at the point in the process flow where the oxide growth is required, if exposed to the combination of high temperature and an oxidizing environment.

At the current state of the art, the various problems facing oxidation include the following examples. For FLASH Poly sidewall oxidation the tunnel oxidation encroachment limits operating temperature to below 700° C. Also, dopant diffusion limits operating temperature to 750° C. For shallow trench isolation (STI) liner oxidation requires conformal oxidation to reduce stress and leakage.

Plasma oxidation as well as UV photon-enhanced oxidation have been described in a number of technical journals and papers. This topic has been an area of research at universities as well. Presently, the leading edge IC manufacturers carry out the most research in this area. Recently, various equipment suppliers have tested hardware in the field that provides various plasma oxidation capabilities.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

This invention describes apparatus and methods for selectively or non-selectively oxidizing silicon, poly-silicon or other semiconductor materials on semiconductor wafers over a range of temperatures from 700° C. down to room temperature. The oxidation is performed with the use of a type of plasma source that produces from a feed gas or gas mixture various reactive species, including but not limited to H, O and or OH radicals and ions, in such proportions that it selectively does not oxidize specified other materials exposed on the wafer surface that are also exposed to the process. These processes are controllable within a substantial window of conditions of process gas flow, pressure and plasma source power, that do not expose the work piece to contamination and are suitable for manufacturing of semiconductor devices. Other embodiments include injection of H2O steam as one constituent of the gas mixture fed into the plasma.

BRIEF DESCRIPTION OF THE DRAWINGS

The accompanying drawings, which are incorporated in and constitute a part of this specification, exemplify embodiments of the present invention and, together with the description, serve to explain and illustrate principles of the invention. The drawings are intended to illustrate various features of the illustrated embodiments in a diagrammatic manner. The drawings are not intended to depict every feature of actual embodiments nor relative dimensions of the depicted elements, and are not necessarily drawn to scale.

Various other objects, features and attendant advantages of the present invention will become fully appreciated as the same become better understood when considered in conjunction with the accompanying detailed description, the appended claims, and the accompanying drawings, in which:

FIGS. 7A and 7C illustrate plasma oxidation sheet resistance results for TiN, while

FIG. 8 illustrates selective oxidation process window for TiN in steam plasma, while FIG. 9 illustrates selective oxidation process window for W in steam plasma.

FIG. 10 illustrates an example of rotating baffles for variable UV illumination.

FIG. 11 illustrates the effects of adding O2 to the steam, while

DETAILED DESCRIPTION

1. Embodiments of Apparatus for Performing PALTROX

Figure 1:
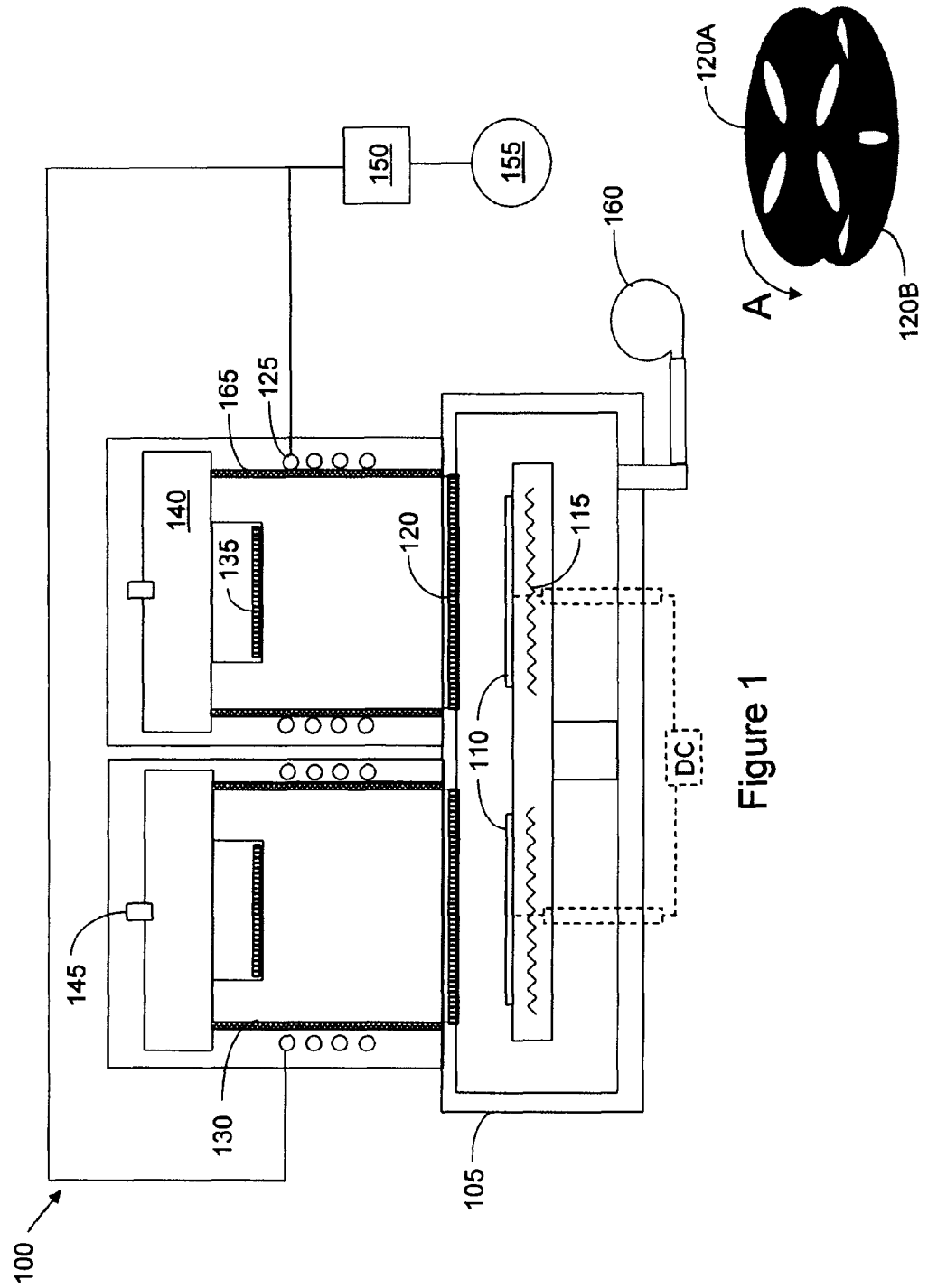
FIG. 1 illustrates a plasma reactor according to an embodiment of the invention.

The invention provides methods and apparatus for performing plasma assisted low temperature radical oxidation, hereinafter referred to as PALTROX. According to an embodiment of the invention, the apparatus that could be used to perform the low temperature plasma enhanced processes is based on the Suprema® system available from Mattson Technology of Fremont, Calif. A description of the base Suprema system can be found in other documents and a drawing of the system as modified according to an embodiment of the invention is shown in FIG. 1.

The system 100 has a main processing chamber body 105, enabling processing of two wafers 110 simultaneously. A throttle valve 160 is capable of controlling the gas pressure in the process area. The pressure range can be controlled over a range from 50 mTorr to 5 Torr but usually in the range of 100 mTorr to 1 Torr. A susceptor heater 115 placed under each substrate 110 maintains the substrate at a constant temperature during processing. The susceptor control temperature may be set at values ranging from room temperature up to 400° C.

Plasma is ignited and maintained by an inductively coupled plasma source (ICP) 125 employing an electrostatic shield 165 to reduce capacitive coupling between antenna and plasma. The source load is connected to automatic matching network 150 with an RF power generator 155 that, in this example, operates at 13.6 MHz. The source generates plasma inside a quartz cylinder 130 mounted directly above the wafer 110. Process gases, whose composition and flow rates are controlled by flow controllers not shown in the figure, enter the source from a gas port 145, through a gas diffuser 140 situated in the center of a top plate of the source, and via showerhead 135. Plasma is maintained below the showerhead 135 and plasma species exit at the bottom through a grid or baffle structure 120 that separate(s) the source volume from the process chamber 105 containing the susceptor and wafer. The RF power can be adjusted from 0 to 3.0 kW, but higher powers up to 10 kW are also available.

The ICP source incorporates a slotted electrostatic shield 165 between the source coil and the walls of the quartz confinement chamber. The electrostatic shield serves to reduce the capacitive coupling between the plasma and the source that lowers the RF displacement current, which would otherwise flow through the plasma and into the grounded components of the process module and the wafer. This feature serves to reduce the flux of charged particles onto the surface of the wafer.

The grid or baffle structure 120, which may include single or multiple grids or baffles, serves as a device to facilitate in the recombination of ions with electrons, thus limiting the charged particles that enter the process area. In this example the grid structure 120 is made of quartz, but other materials may also work including Al2O3, AlN, Y2O3, YAG or a suitable metal coated with one of these materials. In some cases a conducting material may be used such as aluminum.

The grid structure 120 also functions as a secondary showerhead and aids in providing a uniform flux of radicals above the wafer 110. The arrangement and sizes of holes can be used to adjust the flow distribution over the wafer surface. Further, the grid may also be designed so as to serve as a heat and UV radiation shield. In such configuration, its function as a heat shield greatly reduces the IR thermal radiation from the wafer and pedestal, in the event such are heated for the process, that would cause the plasma source walls to be hotter than if heated only by the plasma. Furthermore, it may also be designed as a radiation shield which reduces the UV from the plasma source that is incident on the substrate being processed. Control of such UV radiation is important to controlling the rate of oxidation and uniformity thereof, both for silicon and other materials on the surface of the substrate.

A gas panel (not shown) containing a set of mass flow controllers, regulators and valves provides the prescribed mixtures of gases to the ICP source gas port 145 as well as providing purge gases. Gases provided include but are not limited to O2, O3, H2, D2, N2, Ar, He, Kr, NH3, H2O or D2O.

A machine controller (not shown) operates the system and executes a predetermined set of sequential process steps as in a process recipe. The machine controller also automatically loads and unloads substrates for continuous operation.

According to another embodiment, the process module would include these additional attributes. A susceptor heater made of ceramic materials capable of operation in excess of 700° C. The ceramic material is robust to either strong reducing or oxidizing environments. The ceramic material may be AlN, although other materials or coatings could be considered. The susceptor has a capability that electrical contact is made with the back of the wafer. The electrical contact is made in such a way that a DC bias can be applied to the backside of the wafer. The purpose of this biasing capability is to place the substrate at a positive potential to enhance the diffusion of the negatively charged radicals through the oxide towards the oxide silicon interface and thus provide enhanced oxide growth.

In one embodiment, the walls of the process chamber are lined with a material that minimizes contamination. Liners that would serve this purpose can be made of a number of materials including quartz, Al2O3, AlN, Y2O3, YAG to list some. The liners can also be made of a suitable metal such as aluminum or stainless steel and either anodized or coated with one of the aforementioned materials.

As noted above, the grid structure that separates the wafer environment from the plasma source environment may also serve as a heat shield to protect the plasma source and all of its components from excessive heating. More than one grid can be installed to improve the shielding effect without adversely affecting the delivery of radicals to the wafer surface since the hole distribution and size can be suitably chosen in each grid separately, and for round grids their relative positioning varied to permit more or less UV radiation from the source to pass through. Various materials can be used to fabricate the grid, although quartz has been found to be optimal.

Figure 3:
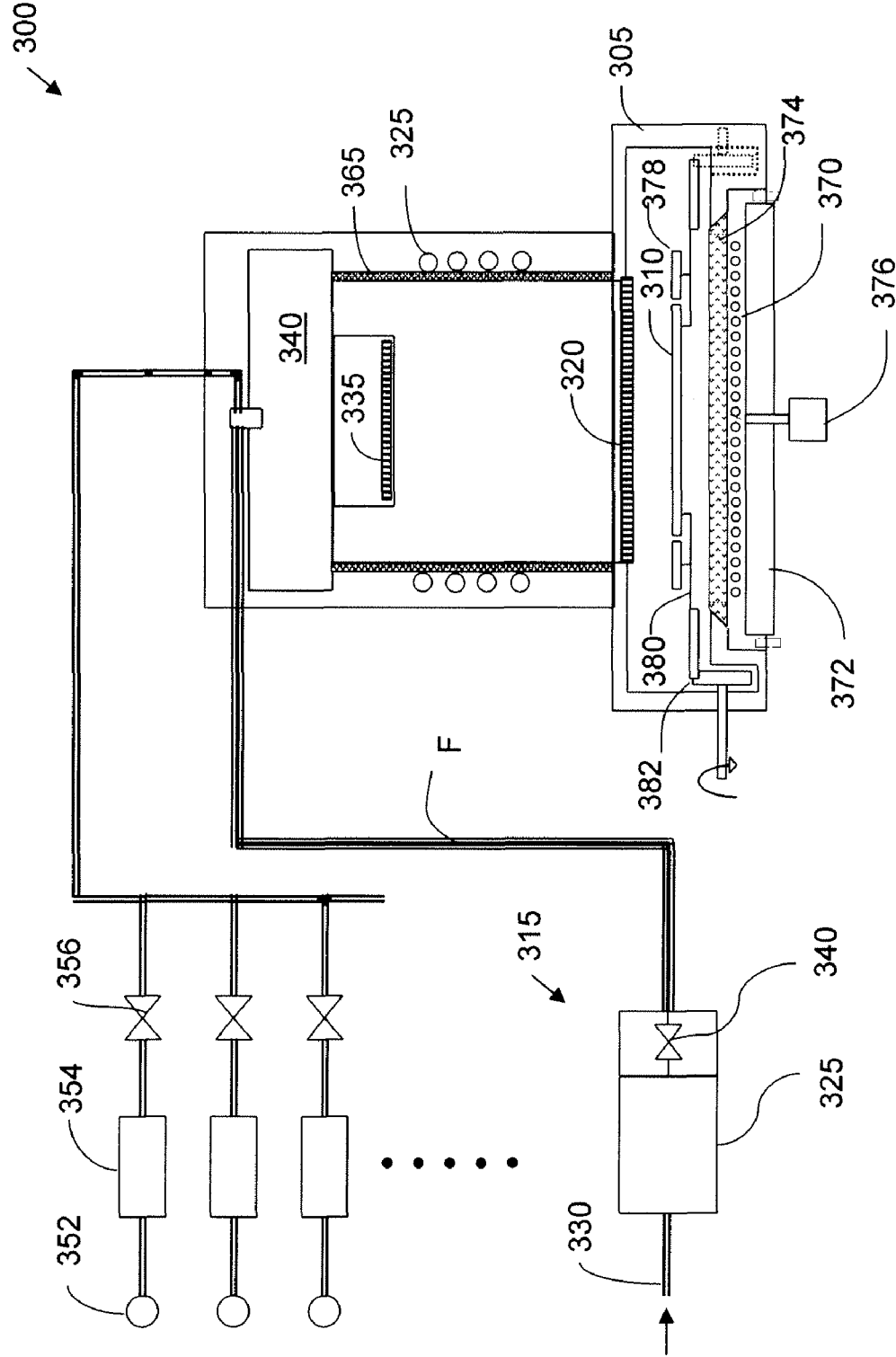
FIG. 3 illustrates an apparatus according to another embodiment of the invention.

According to yet another embodiment of this invention, an apparatus that could be used to perform the PALTROX processes is based on a modified version of the Low Pressure Anneal (LPA) module developed by Mattson Technology. The apparatus 300 is illustrated in FIG. 3, comprising a vacuum anneal process module 305 with the ICP source 325 on the topside. Of course, another type of plasma source could be used with this system by simply exchanging the ICP source. The wafer 310 is heated directly from the backside with a set of tungsten halogen lamps 370. A thick quartz window 374 allows transmission of the lamp radiation to heat the wafer. A control system 376 compares the output of the wafer temperature measurement system with a set point temperature to obtain close loop control of the temperature.

Some specific attributes of the apparatus of FIG. 3, as adopted to perform the PALTROX process, would include the following. The oxidation is performed in a vacuum process module that is capable of controlling the pressure and flow of gases into the process area 305. The pressure range can be controlled over a range from 50 mTorr to 760 Torr but usually in the range of 100 mTorr to 10 Torr. The pressure near the higher end (760 Torr) is typical of post-oxidation anneal, but is not limited to anneal because high pressure plasma generation may also be employed Energy is provided by a lamp heating system comprising a set of tungsten halogen lamps 370, a reflector lamp holder 372 that supports the lamps and provides cooling, a lamp power supply (not shown) and control system to control the lamp power (not shown). The chamber has a window 374 mounted in the bottom of the chamber that allows direct radiation from the lamp system to heat the wafer and wafer support structures. A temperature control system 376 monitors the temperature of the wafer and controls the lamp power supply system so that the wafer can be ramped to a desired temperature and held at the desired temperature. Wafer temperature ramp up rates are on the order of 50° C./s and cool down rates are about 25° C./s, on average. In this example, a guard ring structure 378 is provided to improve the heating uniformity. The wafer and guard ring are supported by a quartz support 380. Also, in this example, a rotation mechanism 382 is provided in order to rotate the wafer during processing to achieve better uniformity.

The wafer is placed on a wafer rotation system that rotates the wafer during processing to enable more uniform heating. The topside of the process module system consists of an ICP plasma source similar to the one already described for generating radicals for the purpose of performing plasma oxidation. A gas panel containing a set of mass flow controllers, regulators and valves, provides the prescribed mixtures of gases to the ICP source gas injector as well as providing purge gases. Gases provided include but are not limited to O2, H2, D2, N2, He, Ar, Kr, NH3, H2O or D2O. This system allows wafers to be heated to temperatures up to 600° C. to form the 'low temperature' plasma oxide. Higher process temperatures, up to 1200° C. are also available.

Subsequent anneal steps in a non-oxidizing ambient can be performed in the same chamber as part of the same process sequence. The annealing temperature could be up to 1200° C. This feature has an important advantage over the prior embodiments for processes requiring an anneal step to follow. Plasma-assisted processing or subsequent annealing can be performed with temperature-time cycles that are "soak" processes or "spike processes". Alternative heat sources, such as heating with arc-lamps, lasers, RF or microwave energy, or streams of energetic particles, can also be employed.

Other means of producing the radical species can be used. The production of the radical species required for plasma oxidation from O2, H2, D2, N2, He, Ar, Kr, NH3, H2O or D2O gas can be accomplished by other means than those listed above. The following is a list of some of means that radical species can be produced. These means can be used in place of or in conjunction with the means described above. A plasma source may be employed, that uses an electron cyclotron resonance, microwaves, inductive coupling, or plasma jet, as the primary means to generate a plasma in gas to which the wafer is exposed. The plasma source may be located in the process chamber so that it generates the plasma on or near the wafer surface, or it may be located up stream from the wafer so that wafers are not exposed to the direct plasma from the source but rather just the gas issuing from the source. In the case of plasma jet, such a source may operate at or near atmospheric pressure. Since the jet is usually concentrated into a cross section area of a few centimeters squared, multiple sources may be required in the process chamber to form plasma just above or in contact with the wafer surface. In the case of a single jet located upstream from the wafer, it could produce radicals that would flow into a chamber volume at the same or lower pressure than the plasma jet source. Radicals can also be generated as by-products of chemical reactions, or decomposition of an unstable species. For example, they can be generated from ozone, or from a flame arising from a chemical reaction. Such flow of gas species to the wafer may be shaped or distributed by grids or baffles that are interposed between plasma source and wafer.

Also, Photo excitation of gas molecules and atoms can be done with the use of Far Ultra-Violet (UV) spectrum (200 nm-122 nm, 6.2-10.2 eV) or Middle UV (300 nm-200 nm, 4.13-6.2 eV). Various sources can be used including excimer lamps, mercury lamps and various laser sources (excimer, quadrupled pulsed YAG, etc.) to name a few. The plasma produced in the process chamber by the plasma source can also provide suitable UV radiation for this purpose. One type of such source would produce short wavelength radiation in the vacuum UV region of the spectrum. A wafer is exposed to this radiation in the gas environment. This process may be carried out at any pressure.

Figure 2:
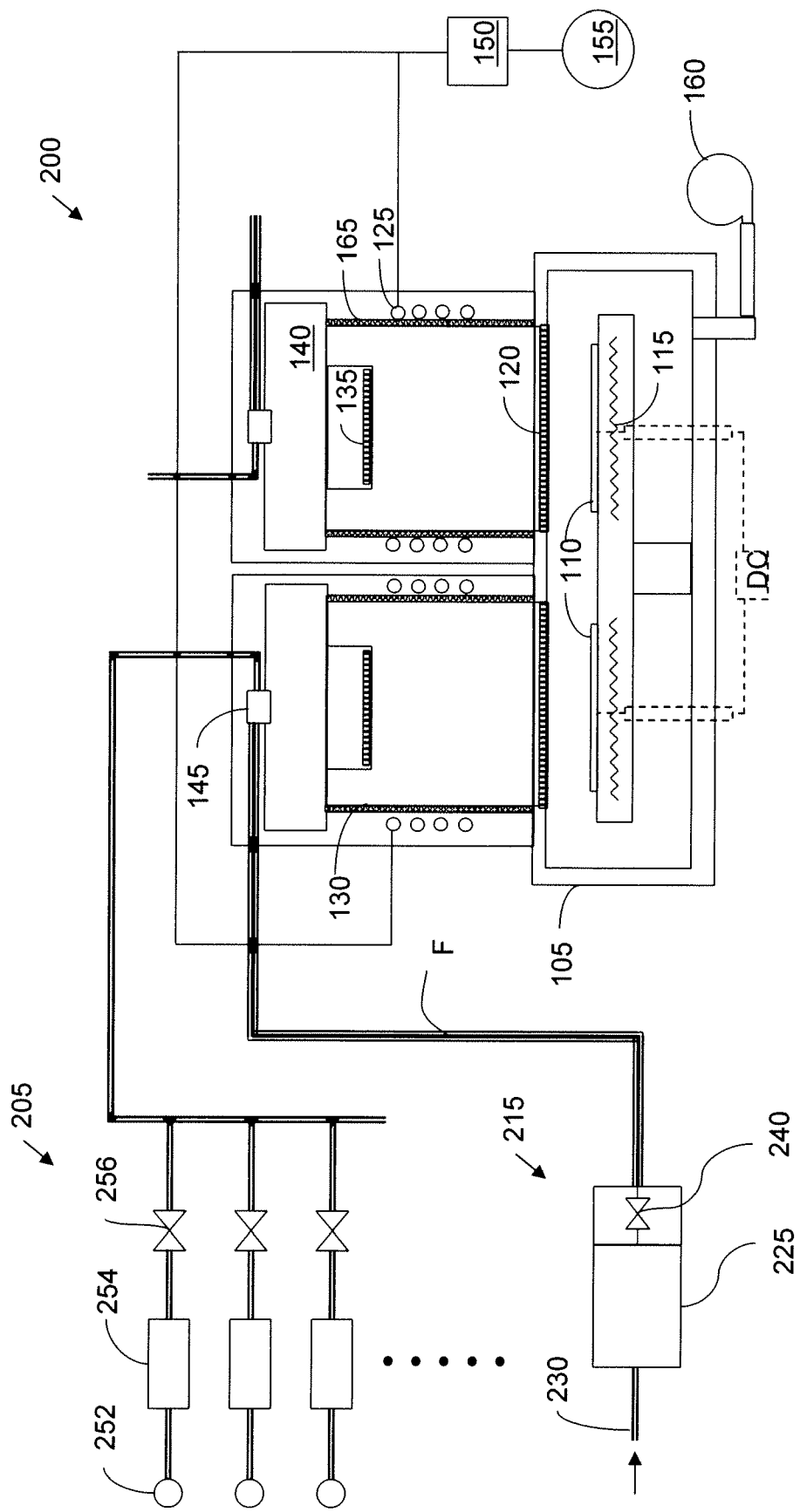
FIG. 2 illustrates an apparatus enabling steam co-injected plasma source, according to an embodiment of the invention.

According to an embodiment of the invention, a silicon plasma oxidation process is performed in an apparatus enabling steam injection into the plasma. The chamber has provisions for injecting various gases, e.g., H2, O2, Ar, etc. to sustain plasma, and in addition, provisions for injecting steam into the plasma. An example of such an apparatus is illustrated in FIG. 2. In FIG. 2, plasma reactor 200 is similar to that illustrated in FIG. 1, although it should be appreciated that other plasma reactors may be used. In FIG. 2, 205 indicates plasma precursor gas supply, while 215 indicates steam supply. Steam is generated at steamer 225, which generates steam from DI water supply 230. Steam may be generated by, e.g., a pyrogenic or catalytic generator or by boiling or bubbling of high purity water. Steamer 225 may be, for example, RASIRC steamer available from RASIRC of San Diego, Calif. The flow of steam into the reactor is controlled by valve 240. By controlling the steam flow and gas flow, one can control the ratio of the gas species to steam. Gas flow may be provided using a plurality of delivery channels, each comprising a precursor gas source 252, a mass flow controller 254, and a shut off valve 256. In one example, gas delivery includes O2 and H2, each of which can be dialed from zero flow up to a desired ratio, so that steam may be mixed with O2 only, with H2 only, or with both H2 and O2.

The apparatus of FIG. 3 may also be adapted to enable enabling steam injection into the plasma. Process gasses are provided to the plasma from gas sources 352, mass controllers 354 and shut off valves 356. Steam is generated at steamer 325, which generates steam from DI water supply 330. The flow of steam into the reactor is controlled by valve 340.

2. Embodiments of Processes for Performing PALTROX—Plasma

A thin oxide film can be grown on a silicon substrate by using, for example, either of the processing reactors described above. According to various methods described below, the process is performed by properly controlling species of O, H and OH in the plasma. Notably, various variables have been investigated to find the conditions that provide the widest process window for various structures. Selective oxidation of silicon in the presence of TiN or tungsten has been investigated, among others.

According to aspects of the invention, the oxidation process is improved by controlling and intentionally limiting the exposure of the substrate to ions produced in the plasma, so as to minimize damage or degradation of the oxide film. A limitation of conventional plasma chambers is that energetic species from the plasma reach the surface of the wafer. These energetic or charged species can cause lower quality of oxide, with poor electrical characteristics such as increased trapped charge defects in the grown oxide. Trapped charge defects lead to breakdown of the dielectric at lower field strength. Further, plasma also produces some vacuum UV radiation which may have harmful effects on the properties of the grown oxide.

According to further aspects of the invention, O, H, and OH (or OD) radicals flow from the plasma and pass proximate to the substrate, thereby enabling, among others, oxidation at low temperatures. Additionally, this arrangement enables improved selective oxidation wherein oxide is grown on silicon or polysilicon while not oxidizing adjacent exposed materials, such as tungsten or other materials such as TiN, TaN or WN. In one example, the distribution of the species from the plasma across the wafer is controlled using a grid or baffle structure, such as, e.g., baffle 120 shown in FIG. 1. Alternatively, a remote plasma source may be used where the plasma is maintained away from the substrate and the radicals are directed to flow over the substrate while preventing ions from reaching the substrate.

The oxidation process utilizing O, H, and OH radicals and minimizing ions (e.g., $O^-$, $O^+$, H, $H^+$, $OH^+$, $OH^-$, $OD^+$, $OD^-$) enables formation of conformal oxides. Prior art techniques that expose the substrates to the plasma ions result in inferior oxides which do not conform well to the underlayer. It is believed that the reasons for the non-conformity may be surface excitation processes or local charging effects caused by ion bombardment of the substrate.

According to another aspect of the invention, it is believed that upon reaching the surface of the substrate, some of the O and OH radical cause a negatively charged oxygen ion to be formed within the silicon oxide. Therefore, as shown in broken line in FIG. 1, a DC bias is applied to the wafer to generate an electric field across the oxide so as to attract the negative ions. Consequently, the flux of the oxygen ions through the oxide film to the oxide-silicon interface is enhanced, resulting in higher growth rates. With application of a DC bias to the substrate the flux of ionic species of oxygen, radicals can be controlled. This also helps to sustain an electric field across the oxide layer that is being grown, which causes mobile negative oxygen ions to diffuse through the growing film and sustain its growth.

A plasma chamber, such as that shown in FIG. 1, has been used to investigate plasma assisted oxidation of silicon or poly-silicon and to investigate selective oxidation. More specifically, the effect of various variables on the plasma assisted oxidation process has been performed. Among the variables investigated are gas pressure in the process chamber, power to the RF plasma source, power to the RF bias, substrate temperature, and relative flow of O2 and/or H2.

Figure 4:
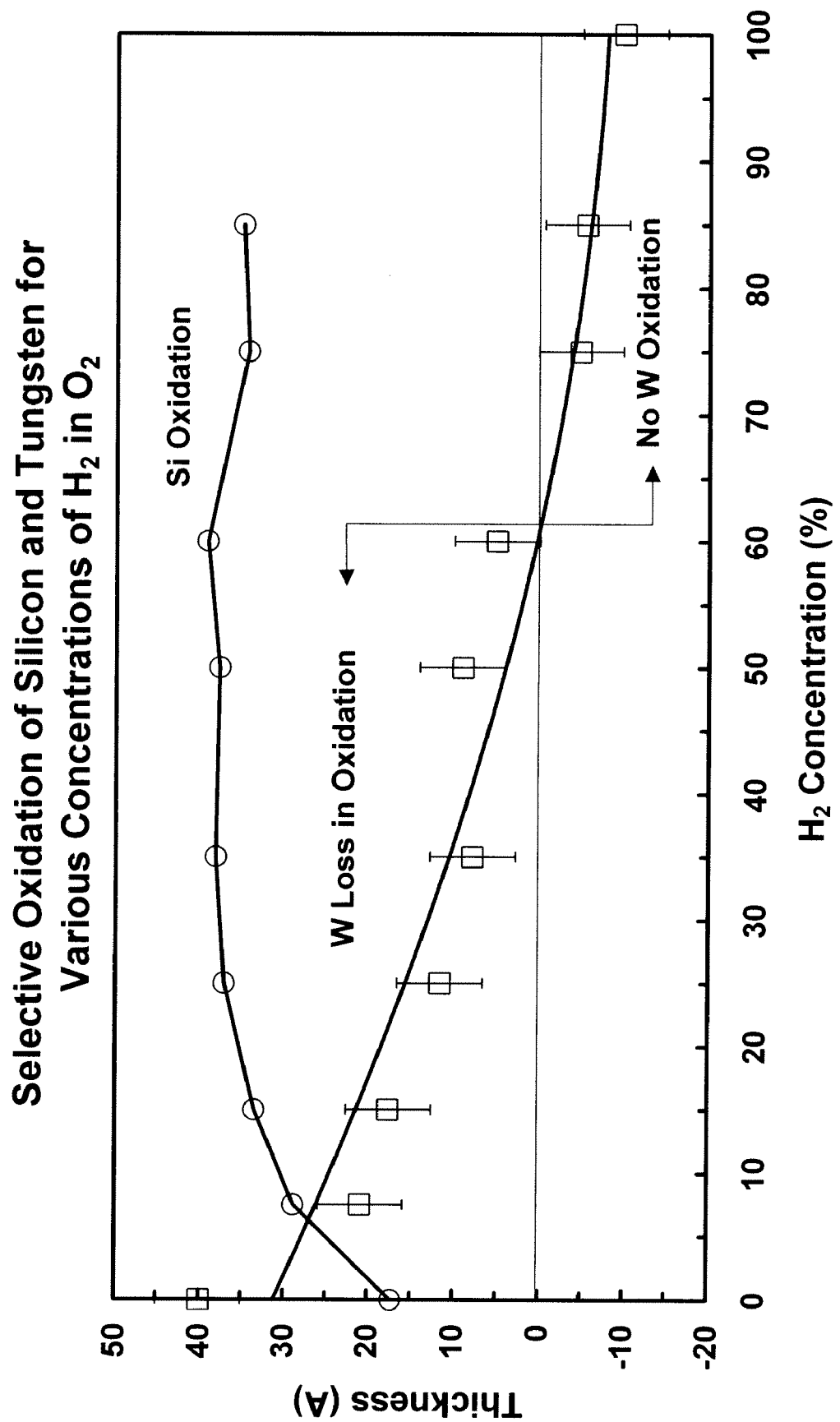
FIG. 4 is a plot of results from investigation of plasma assisted oxidation of silicon with respect to tungsten.

FIG. 4 is a plot of results from investigation of plasma assisted oxidation of silicon along with that of tungsten. The vertical axis indicates the oxide layer thickness, while the horizontal axis shows the partial flow of H2 in the O2+H2 gas mixture. The initial native oxide film thickness was 12-13 Å. For this particular run the substrate temperature is held at 300° C., the pressure is held at 500 mT, the source power is 2500 W and each run was performed for 200 seconds. FIG. 4 illustrates that at flow of about 60% H2 concentration, silicon oxidation is at maximum, while perhaps a minimal amount of tungsten oxidation occurs. From FIG. 4, the polynomial curve fit to the measured W loss seems to indicate zero W oxidation or tungsten oxide reduction at or above 60% H2 concentration. Consequently, it is seen that for effective selective oxidation of silicon in the presence of tungsten, the concentration of H2 gas must be above about 60%. On the other hand, for a concentration of H2 gas above 85%, the oxide growth may be of lower quality and at some point would actually stop. Therefore, for effective selective oxidation of silicon in the presence of tungsten, the concentration of H2 gas should be maintained to below 95%, and in some cases even below 85%. From that, it is concluded that for oxidizing silicon in the presence of tungsten, especially in plasma without steam, the concentration of H2 gas by flow rate should be maintained at between about 60-95%, and, sometimes to between 60-85%.

Figure 5:
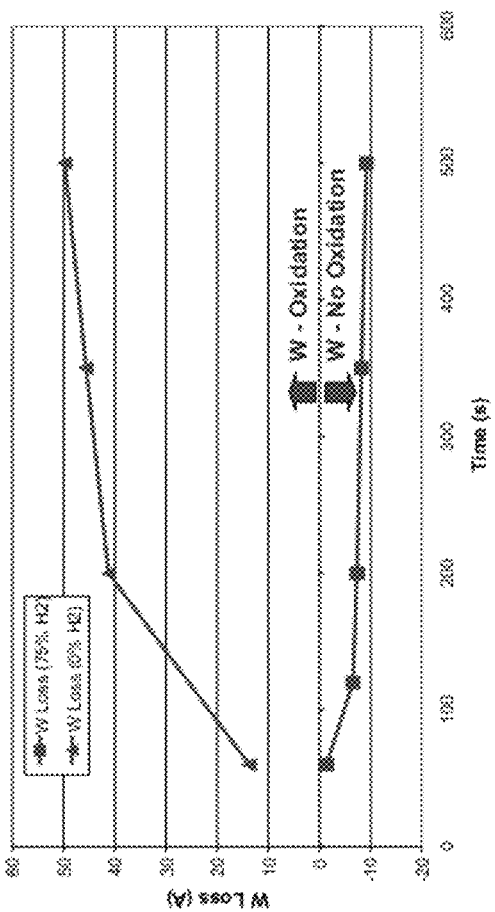
FIG. 5 illustrates results obtained for tungsten plasma oxidation.

FIG. 5 illustrates results obtained for tungsten plasma oxidation performed at 300° C. for various times with two different ambient conditions while the power is constant, demonstrating the selective and the non-selective (metal oxidation) process. In FIG. 5, square data points indicate processing with H2 to O2 flow ratio of 3.0, (H2 fraction of total=75%), while triangular data points indicate processing with no H2 flow. As can be seen, oxidation of tungsten increased with processing time when no H2 was present, while no oxidation of tungsten occurred at H2/O2 ratio of 75%, which is consistent with the results shown in FIGS. 3 and 4.

Figure 6:
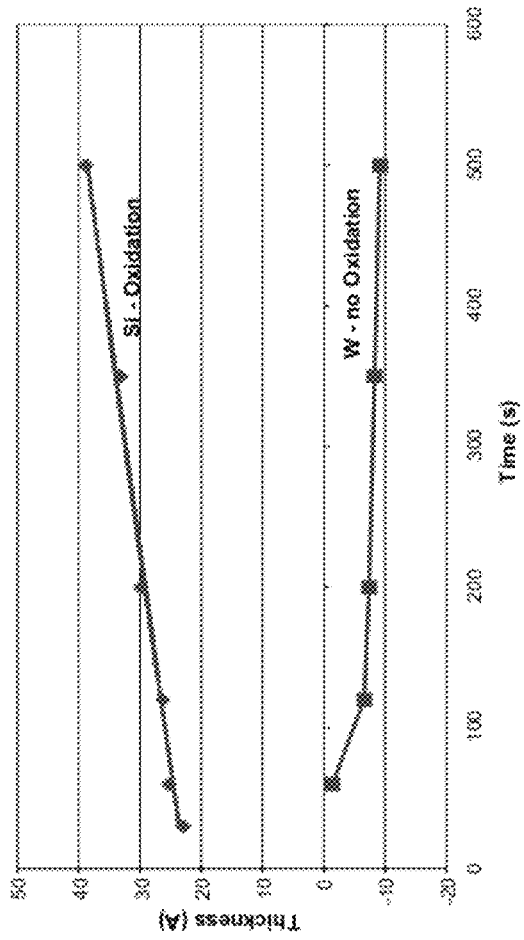
FIG. 6 illustrates the results for selective silicon oxidation in the presence of tungsten using 75% H2 in H2+O2 plasma.

FIG. 6 illustrates the results for selective silicon oxidation in the presence of tungsten using 75% H2 in O2 plasma. As can be seen, while silicon oxidation progressed with time, no tungsten oxidation occurred for the entire duration. Therefore, effective plasma oxidation of silicon selective to tungsten can be performed with H2/O2 ratio of 75%.

3. Embodiments of Processes for Performing PALTROX Using Plasmas Injected with Gas Mixtures Including Steam The following describes improved processes for performing selective oxidization of silicon in the presence of one or multiple metals and metal nitrides. It has been reported that Ti/TiN/WN stack has been used in experiments as a barrier between Poly-Si and W gate. The barrier Ti/TiN/WN, or any one of its components, may be present with the W gate and hence the need to find the common process window for these barrier materials and W is clear. In general, the process windows for avoiding oxidation of such metals or silicides do not overlap and in some cases no overlap may exist. The inventors have discovered a silicon plasma oxidation process selective to TiN and W using a steam co-injected with H2 gas into a plasma source having a common process window between room temperature and 400° C. This was not expected based on our previous tests of gas mixtures of hydrogen and oxygen gases without steam. In one set of process conditions at 400° C., the window between 50% to 90% H2 in steam has been found to selectively oxidize silicon in the presence of both TiN and W.

Figure 7B:
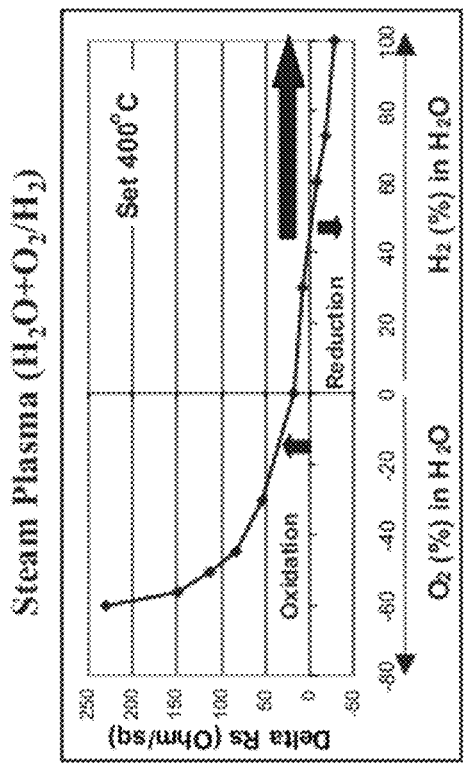
FIGS. 7B and 7D illustrate steam plasma oxidation sheet resistance results for TiN.
Figure 7D:
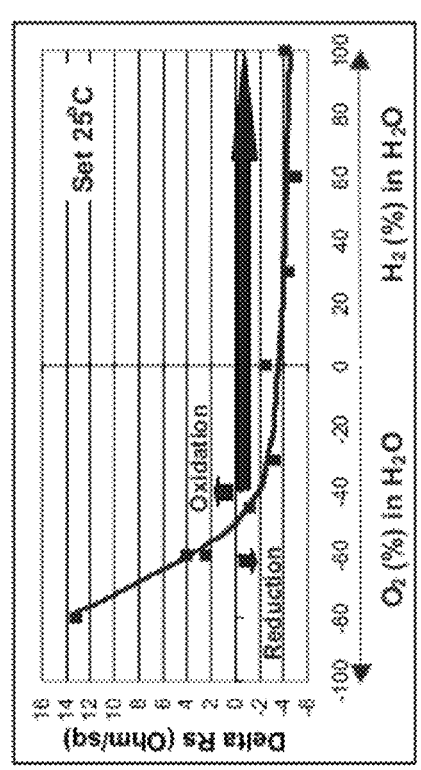
Figure 7A:
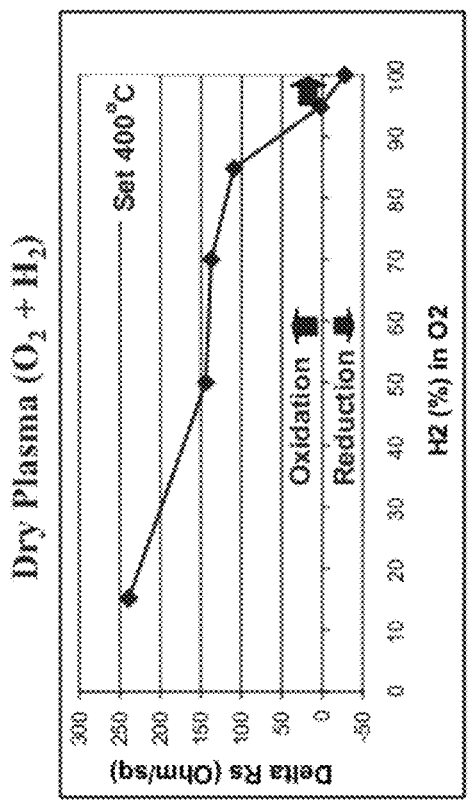

FIG. 7A illustrates plasma oxidation change of sheet resistance results for TiN at 400° C., which are favorable conditions for silicon oxidation. As can be seen, the TiN layer is oxidized for all conditions, except for very high H2 content. Such a high H2 content is not desirable for silicon oxidation, in the presence of tungsten. Conversely, as can also be seen from FIG. 7A, if the oxidation is performed at the H2/O2 ratio favorable for selectivity to tungsten, i.e., 60-85%, the TiN layer would be oxidized. Which may be detrimental to the performance of the device.

Figure 7C:
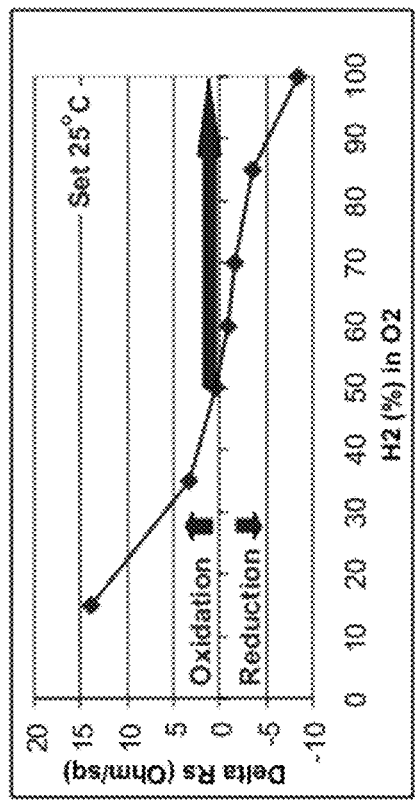

FIG. 7C illustrates plasma oxidation sheet resistance results for TiN at 25° C. It is seen that lowering the temperature reduces the oxidation of TiN and may enable oxidation of silicon at the H2/O2 ratio favorable to Tungsten. However, the quality of oxide formed at low temperature is low, which adversely affects the properties of the oxide layer. It is therefore more effective to perform the oxidation at higher temperatures.

FIG. 7B illustrates steam plasma oxidation sheet resistance results for TiN at 400° C., which are favorable conditions for silicon oxidation. As can be seen, the presence of steam in the plasma drastically enlarges the process window for selective oxidation in the presence of TiN. FIG. 7D illustrates steam plasma oxidation sheet resistance results for TiN at 25° C., which also shows an enlarged process window. As can be seen, utilizing the 60-85% H2/O2 ratio causes no oxidation of TiN.

Figures 8, 9:
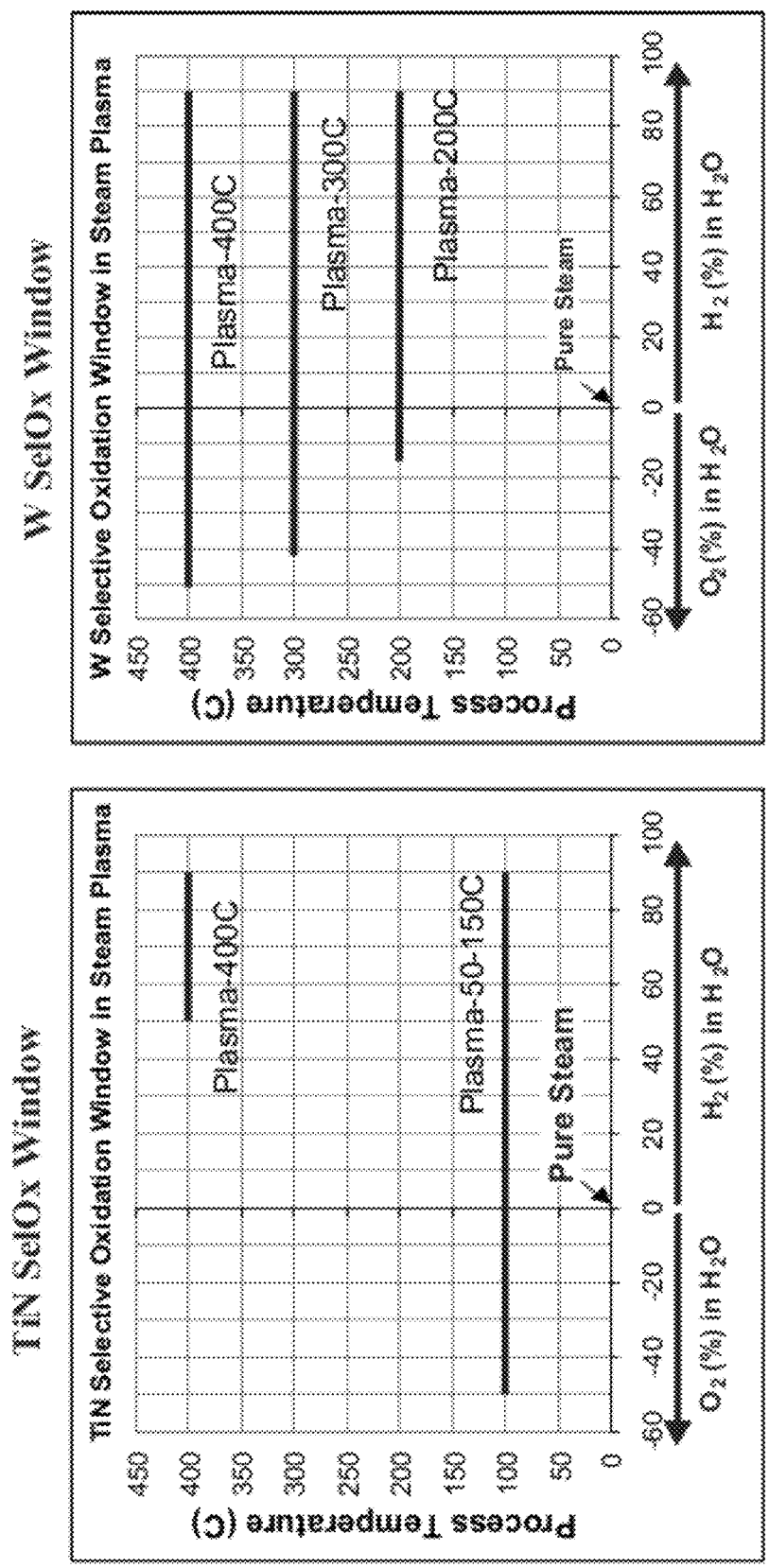

FIG. 8 illustrates selective oxidation process window for TiN in steam plasma, while FIG. 9 illustrates selective oxidation process window for W in steam plasma. Comparison of these two plots shows that at 400° C., which is a beneficial temperature for silicon oxidation, the process windows overlap when the amount of H2 in the H2O steam is between about 50-90%. Note also that FIG. 9 shows that the process window for tungsten at 400° C. has been dramatically increased due to the presence of steam. In fact, when steam plasma is used O2, rather than H2 may be added to the steam.

Figure 12:
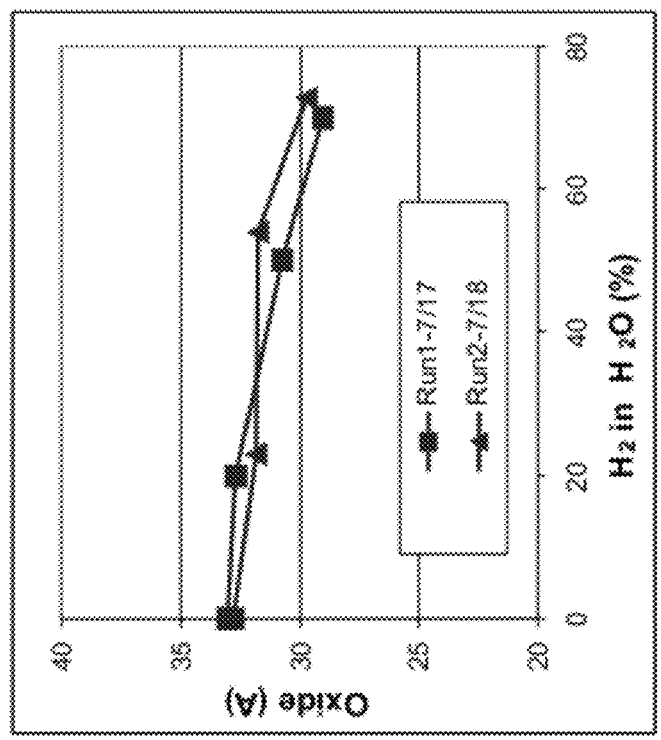
FIG. 12 illustrates the effect of adding H2 to the steam.
Figure 11:
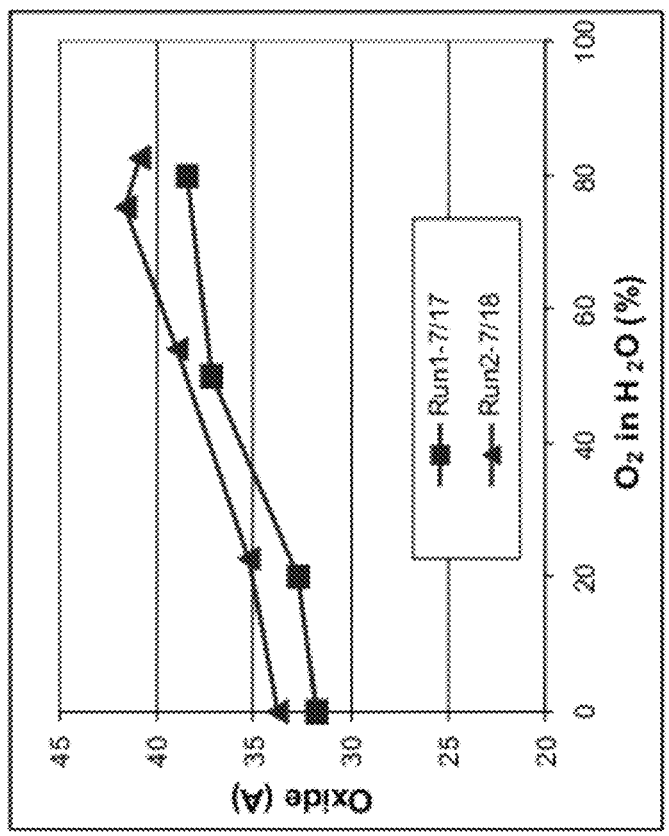

FIG. 11 illustrates the effects of adding O2 to the steam, while FIG. 12 illustrates the effect of adding H2 to the steam. While FIG. 11 suggests that adding O2 to the H2O steam is preferable, this may not be optimal when other metals or metal nitrides are present, since adding oxygen may cause oxidation of those metals and nitrides. On the other hand, FIG. 12 illustrates that adding H2 does not materially change the oxidation rate of silicon, which is better for selective oxidation as shown in FIGS. 8 and 9.

5. Embodiments of Processes for UV Oxidation Enhancement

The following is a discussion of improving growth rate of low temperature silicon oxides in presence of metals and metal nitrides while avoiding oxidation thereof by use of UV radiation of the substrate. Selective, radical-based, low temperature oxide growth on silicon, that does not also oxidize any of the exposed metals or metal nitrides, generally has low growth rates and small process window when using hydrogen/oxygen gas mixtures. One reason for low growth rate is the insufficiency of activating reactions necessary for the growth of the silicon oxide occurring at the interface between the already grown oxide and the silicon beneath it. One such growth-rate enhancement method, ion bombardment, has the undesirable side effect of causing damage to both silicon oxide and to exposed metals/nitrides. We propose that UV activation can be used to accelerate the growth rate of the silicon oxide while not damaging the formed layer. We have found that the use of mixtures including water vapor as well as hydrogen and oxygen along with UV illumination of the substrate greatly improves growth rate of silicon oxide on silicon while substantially increasing the process window for avoiding oxidation to any of the exposed metals or metallic nitrides. Since the degree of enhancement of the oxide growth rate will vary depending on the particular application or device integration scheme employed, having a variable degree of UV enhancement may prove beneficial for IC fabrication equipment used in mass production.

To be sure, the use of UV radiation in the context of plasma oxidation has been reported in the literature. However, prior studies utilized UV radiation of the plasma to enhance molecular dissociation in the plasma itself. In this work we disclose that UV irradiation of the substrate enhances the growth mechanism at the oxide-silicon interface, possibly by activating the formation of negative oxygen ions in the surface oxide. This is entirely independent of UV illumination of the gas phase species to enhance dissociation.

UV radiation enhancement can be efficiently done in different ways. One natural way is to use the UV generated in the plasma source that is employed for generation of radicals from feed gases. The difficulty lies in making such UV intensity variable independently of the gas mixture or source power. One such way of varying UV without varying mixture or source power involves varying the transparency of the baffles 120. This can be done by, e.g., the use of a pair of partially open or partially transparent baffles or grids 120A and 120B (FIG. 10) with hole patterns whose degree of overlap can be controlled by rotation of one of them as shown by arrow A. Another way is to use a separate source of UV radiation to illuminate the wafer.

Figure 13:
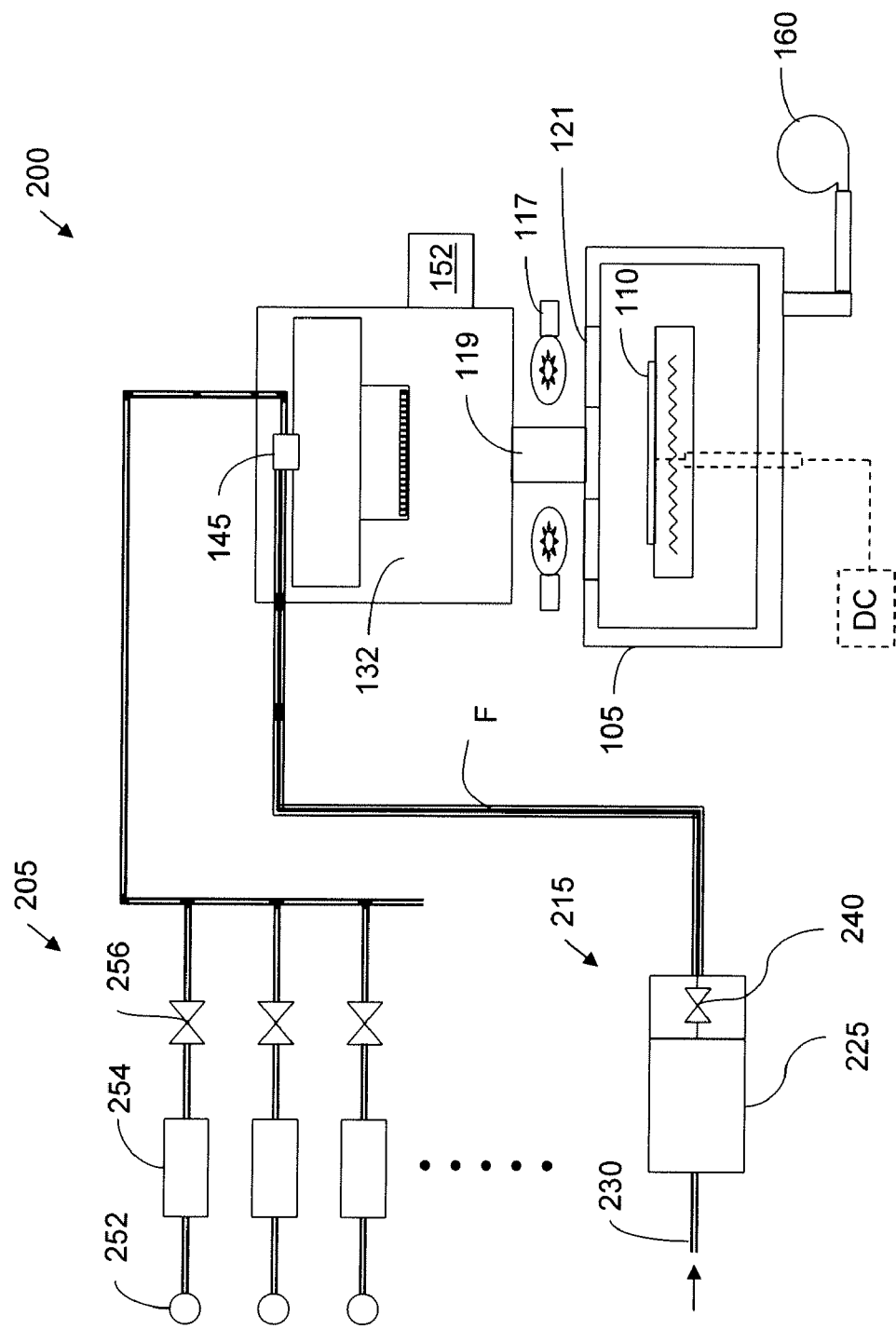
FIG. 13 illustrates an embodiment wherein the plasma is generated in a remote chamber 132, using, e.g., microwave source 152 (although other sources may be used), and utilizing a conduit 119 to enable drift of plasma species towards the wafer 110, which resides in vacuum processing chamber 105.

FIG. 13 illustrates an embodiment wherein the plasma is generated in a remote chamber 132, using, e.g., microwave source 152 (although other sources may be used), and utilizing a conduit 119 to enable drift of plasma species towards the wafer 110, which resides in vacuum processing chamber 105. In this embodiment, UV transparent windows 121 are provided to enable UV radiation from UV sources 117 to illuminate the wafer 110. This may enhance the probability of Si—Si bond breakage, thus increasing the available Si bonding sites to form Si—O.

The addition of a noble gas, such as Ar, Kr, Xe, etc., to a plasma can also be used for the generation of short wavelength radiation in the DUV and VUV portions of the spectrum from the resulting ionization and excitation of the noble gas atoms. The exposure of the process wafer surface to the resulting DUV and VUV radiation together with the radical oxidation species may result in further benefits.

6. Embodiments of Steam Plasma Oxidation

Silicon nitride is difficult to oxidize by conventional thermal oxidation in O2 or H2O, usually requiring a very high temperature and long time. It is known to oxidize in atomic oxygen, including species generated by an oxygen plasma. The use of O2+H2 mixtures activated by a plasma may also allow oxidation of silicon nitride, while also changing the rate and/or the relative rates of oxidation of silicon nitride and other materials. Furthermore, the use of steam in the plasma (on its own or in combination with H2 or O2, or with other gases such as noble gases) can be optimized for controlling the degree of oxidation or the relative rates of oxidation of two materials. For example, steam may be used to enhance or retard the rate of oxidation of silicon nitride relative to that of silicon or another material.

A steam plasma, either on its own or in combination with H2 or O2, or with other gases such as noble gases, can be used to oxidize a wide variety of materials. It may also allow control over the relative rates of oxidation of semiconductor materials that may be present on a wafer. Here the steam may enhance or retard the relative rates of oxidation of any two (or more) materials. For example these materials can be those used for a channel or a source/drain region of a transistor. Materials that can be oxidized by the steam-bearing plasma may be pure or they may be alloys, and they may be doped with different atomic species that affect their electrical conductivity or their lattice spacing. Examples include the following:

a. Oxidation of regions of silicon doped with atoms of another species, such as B, P, As, Sb, In, Ge, C, Sn, S, Se;

b. Oxidation of SiGe alloys;

c. Oxidation of materials used to form new types of transistors: for example Ge; GaAs; InGaAs; alloys comprising In, Ga, P, As; GaN; InGaN; alloys comprising group III elements and group V elements, SiC and carbon-based semiconductor devices;
d. Oxidation to passivate surfaces of the materials described above;
e. Oxidation to form oxide films;
f. Oxidation to form regions that are subsequently removed by etching
g. Oxidation that directly etches the material by forming a volatile species. For example carbon-based devices structures can be etched by forming $CO_2$ or CO gas.

The use of steam provides new opportunities to control the topography of device features, such as trenches. In some cases isotropic oxidation may be desired, with uniform oxidation of surfaces with different orientations, such as sidewalls of a trench. In other cases non-uniform oxidation may be desired. By using steam, or a combination of steam and another gas, we can alter the degree of isotropy in the plasma oxidation process.

Plasma oxidation of silicon generally obeys an Arrhenius like dependence with temperature, but with a much lower activation energy than thermal oxidation owing to the presence of oxygen radicals formed in the plasma. In this work, the oxide growth rate in non-steam oxidation process is enhanced as the hydrogen concentration is increased from zero to about 25% to 50% above which level the growth rate begins to turn over and decrease as hydrogen concentration approaches 100%. For process temperatures between room temperature and 300° C., the oxidation growth rate monotonically increases with higher temperature at each concentration level of $H_2$.

Figure 14:
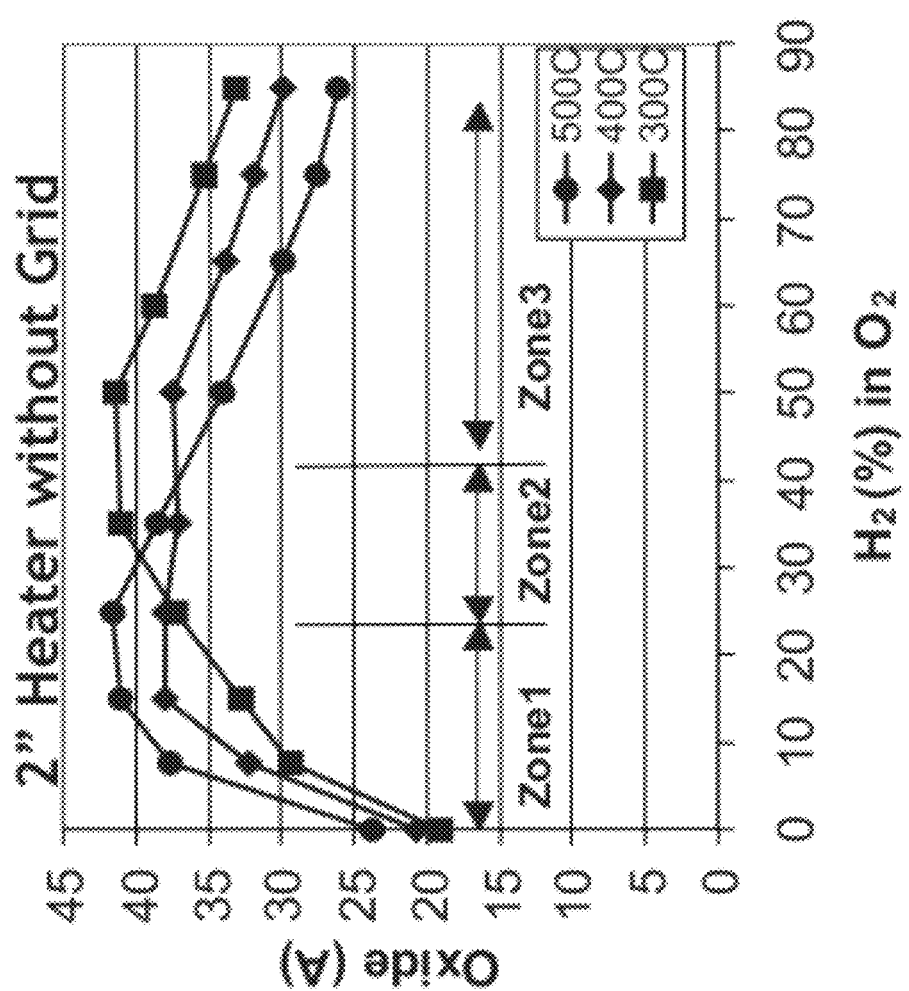
FIG. 14 illustrates the temperature effects on O2+H2 plasma oxidation at a high temperature regime.

In this work a new type of behavior has been discovered where the oxide growth rate does not continue to monotonically increase with temperature. FIG. 14 illustrates the temperature effects on $O_2+H_2$ plasma oxidation at a high temperature regime. The oxidation process was carried out at three different temperatures, 300° C., 400° C. and 500° C. As shown in FIG. 14, at each of these temperatures three different oxide growth rate regimes exist. The first regime, labeled zone 1, for low $H_2$ concentration, the oxide growth increases; in the second, labeled zone 2, for intermediate $H_2$ concentration, the growth rate remains relatively constant; and in the third regime, labeled zone 3, the oxide growth rate actually decreases with $H_2$ concentration and with temperature. This novel result can be important for process control where it is necessary to vary the level of hydrogen to affect one specific process, while maintaining a constant silicon oxide growth.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the server arts. It is intended that the specification and examples be considered as exemplary only, with a true scope and spirit of the invention being indicated by the following claims.

The invention claimed is:

1. A method for selective oxidation of silicon on a substrate in the presence of other materials, comprising:
    placing the substrate having silicon in a vacuum processing chamber;
    generating a plasma remotely from the substrate, such that no part of the plasma touches the substrate;
    injecting into the plasma $H_2$ and $O_2$ gases;
    providing flow path for radicals from the plasma to reach the substrate; and,
    preventing ions from reaching the substrate;
    to thereby oxidize the silicon and grow a layer of silicon oxide from the silicon.

2. The method of claim 1, wherein the concentration of $H_2$ to total gas flow is limited to at least 60%.

3. The method of claim 2, wherein the concentration of $H_2$ flow to total gas flow is limited to less than 85%.

4. The method of claim 1, wherein the concentration of $H_2$ flow to total gas flow is limited to between 60% and 85%.

5. The method of claim 1, further comprising illuminating the substrate with a UV source.

6. The method of claim 5, further comprising injecting steam into the plasma.

7. The method of claim 1, further comprising injecting steam into the plasma.

8. The method of claim 7, further comprising injecting $H_2$ in an amount that is between 50% to 90% of the total gas flow.

9. A method for selective oxidation of silicon on a substrate in the presence of tungsten, titanium nitride, tantalum nitride, or tungsten nitride, comprising:
    providing a substrate having exposed silicon and at least one of tungsten, titanium nitride, tantalum nitride, or tungsten nitride;
    placing the substrate in a vacuum processing chamber;
    generating a plasma remotely from the substrate, such that charged particles from the plasma are substantially prevented from reaching the substrate;
    injecting into the plasma $H_2$ and at least one of $O_2$ gas or $H_2O$ steam;
    providing flow path for radicals from the plasma to reach the substrate;
    to thereby selectively oxidize the silicon and grow a layer of silicon oxide from the silicon without oxidizing the tungsten, titanium nitride, tantalum nitride, or tungsten nitride.

10. The method of claim 9, comprising injecting into the plasma $O_2$ gas in an amount such that the concentration of $H_2$ to total gas flow is between 60% to 85%.

11. The method of claim 9, comprising injecting into the plasma $H_2O$ steam in an amount such that the concentration of $H_2$ to total gas flow is between 50% to 90%.

* * * * *